(12) United States Patent
Higgins et al.

(10) Patent No.: US 11,296,075 B2
(45) Date of Patent: Apr. 5, 2022

(54) HIGH RELIABILITY POLYSILICON COMPONENTS

(71) Applicant: TEXAS INSTRUMENTS INCORPORATED, Dallas, TX (US)

(72) Inventors: Robert M. Higgins, Plano, TX (US); Henry Litzmann Edwards, Garland, TX (US); Xiaoju Wu, Dallas, TX (US); Shariq Arshad, Allen, TX (US); Li Wang, Plano, TX (US); Jonathan Philip Davis, Allen, TX (US); Tathagata Chatterjee, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/118,648

(22) Filed: Aug. 31, 2018

(65) Prior Publication Data
US 2020/0075583 A1    Mar. 5, 2020

(51) Int. Cl.
| | |
|---|---|
| *H01L 27/06* | (2006.01) |
| *H01L 29/06* | (2006.01) |
| *H01L 21/8234* | (2006.01) |
| *H01L 49/02* | (2006.01) |
| *H01L 21/762* | (2006.01) |
| *G06F 30/392* | (2020.01) |

(52) U.S. Cl.
CPC ........ *H01L 27/0629* (2013.01); *G06F 30/392* (2020.01); *H01L 21/762* (2013.01); *H01L 21/823481* (2013.01); *H01L 28/20* (2013.01); *H01L 29/0649* (2013.01)

(58) Field of Classification Search
CPC ............ H01L 21/762; H01L 21/76232; H01L 21/823481; H01L 27/0629; H01L 28/20; H01L 29/0649
USPC ........................................................ 257/379
See application file for complete search history.

(56) References Cited

U.S. PATENT DOCUMENTS

| | | | | |
|---|---|---|---|---|
| 7,427,787 B2* | 9/2008 | Steinhoff | ............ | H01L 27/0262 257/107 |
| 8,039,925 B2* | 10/2011 | Wong | .................... | H01L 27/088 257/548 |
| 8,174,070 B2* | 5/2012 | Mallikarjunaswamy | .................... | H01L 27/0623 257/341 |
| 8,860,139 B2* | 10/2014 | Sawahata | ............ | H01L 27/0248 257/355 |
| 9,117,845 B2* | 8/2015 | Nassar | ................ | H01L 29/7817 |

(Continued)

*Primary Examiner* — Duy T Nguyen
(74) *Attorney, Agent, or Firm* — Andrew R. Ralston; Charles A. Brill; Frank D. Cimino

(57) ABSTRACT

The present disclosure introduces, among other things, an electronic device, e.g. an integrated circuit (IC). The IC includes a semiconductor substrate comprising a first doped layer of a first conductivity type. A second doped layer of the first conductivity type is located within the first doped layer. The second doped layer has first and second layer portions with a greater dopant concentration than the first doped layer, with the first layer portion being spaced apart from the second layer portion laterally with respect to a surface of the substrate. The IC further includes a lightly doped portion of the first doped layer, the lightly doped portion being located between the first and second layer portions. A dielectric isolation structure is located between the first and second layer portions, and directly contacts the lightly doped portion.

21 Claims, 15 Drawing Sheets

(56) References Cited

U.S. PATENT DOCUMENTS

| | | | |
|---|---|---|---|
| 9,153,569 B1* | 10/2015 | Edwards | H01L 27/0259 |
| 9,461,032 B1* | 10/2016 | Edwards | H01L 29/861 |
| 9,831,232 B2* | 11/2017 | Hong | H01L 27/0262 |
| 9,929,140 B2* | 3/2018 | Edwards | H01L 21/26513 |
| 10,008,616 B2* | 6/2018 | Kim | H01L 29/0649 |
| 10,217,733 B2* | 2/2019 | Marreiro | H01L 27/0262 |
| 10,269,898 B2* | 4/2019 | Edwards | H01L 29/41708 |
| 10,629,723 B2* | 4/2020 | Lin | H01L 29/66143 |
| 2005/0221787 A1* | 10/2005 | Wong | H01L 21/761 |
| | | | 455/333 |
| 2005/0253216 A1* | 11/2005 | Tsuchiko | H01L 27/0629 |
| | | | 257/491 |
| 2007/0008667 A1* | 1/2007 | Steinhoff | H01L 27/0262 |
| | | | 361/56 |
| 2008/0309394 A1* | 12/2008 | Steinhoff | H01L 27/0262 |
| | | | 327/313 |
| 2010/0230719 A1* | 9/2010 | Sawahata | H01L 27/0248 |
| | | | 257/173 |
| 2011/0127602 A1* | 6/2011 | Mallikarjunaswamy | |
| | | | H01L 29/0649 |
| | | | 257/331 |
| 2014/0183622 A1* | 7/2014 | Lin | H01L 29/47 |
| | | | 257/329 |
| 2014/0213024 A1* | 7/2014 | Nassar | H01L 21/0415 |
| | | | 438/234 |
| 2015/0270256 A1* | 9/2015 | Edwards | H01L 27/0259 |
| | | | 257/197 |
| 2015/0340357 A1* | 11/2015 | Edwards | H01L 21/76237 |
| | | | 257/362 |
| 2015/0340358 A1* | 11/2015 | Edwards | H01L 29/7302 |
| | | | 257/357 |
| 2017/0077082 A1* | 3/2017 | Marreiro | H01L 27/0262 |
| 2017/0098644 A1* | 4/2017 | Hong | H01L 27/0262 |
| 2017/0373199 A1* | 12/2017 | Kim | H01L 29/872 |

* cited by examiner

HIGH RELIABILITY POLYSILICON COMPONENTS

TECHNICAL FIELD

This disclosure relates to the field of semiconductor devices, and more particularly, but not exclusively, to improved reliability of polysilicon resistors and other passive integrated circuit components.

BACKGROUND

Integrated circuits include transistors and passive components such as resistors fabricated on a single semiconductor substrate. Resistors may include diffused resistors formed in the substrate, and polysilicon resistors formed in a layer over the substrate. Polysilicon resistor reliability is limited by various failure modes. Such failures typically render the integrated circuit nonfunctional, and may not occur until after being placed into service. Such field failures are an acute concern for semiconductor manufacturers, due to customer inconvenience and possible safety issues.

SUMMARY

The inventors disclose various methods and devices that may be beneficially applied to manufacturing integrated circuits (ICs) with improved resistor reliability. While such embodiments may be expected to provide improvements in initial and long term reliability of such ICs, no particular result is a requirement of the described invention(s) unless explicitly recited in a particular claim.

The present disclosure introduces, among other things, an electronic device, e.g. an integrated circuit (IC). The IC includes a semiconductor substrate comprising a first doped layer of a first conductivity type. A second doped layer of the first conductivity type is located within the first doped layer. The second doped layer has first and second layer portions with a greater dopant concentration than the first doped layer, with the first layer portion being spaced apart from the second layer portion laterally with respect to a surface of the substrate. A lightly doped portion of the first doped layer is located between the first and second layer portions. A dielectric isolation structure is located between the first and second layer portions, and directly contacts the lightly doped portion.

Other embodiments include a method of forming an IC, a method of making a photolithographic mask that implements a well-implant layer of the IC, and a nontransitory computer-readable storage medium having instructions stored thereon that configure a processor to implement the photolithographic mask.

DETAILED DESCRIPTION

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events may be required to implement a methodology in accordance with the present disclosure.

Some physical defects that occur during integrated circuit manufacturing may create a risk of early or long-term device failure due to, e.g. formation of a conductive path between a polysilicon resistor and the circuit substrate. Such a failure may be referred to as a "poly resistor short". The conductive path may form due to dielectric breakdown between the resistor and the substrate caused by high electric field intensity between a defect and the resistor. Embodiments of the invention benefit from the recognition by the inventors that, while such physical defects cannot be eliminated, their effect on device lifetime can be mitigated by reducing the electric field intensity that could otherwise lead to dielectric breakdown and formation of conductive shorts.

Figure 1A:
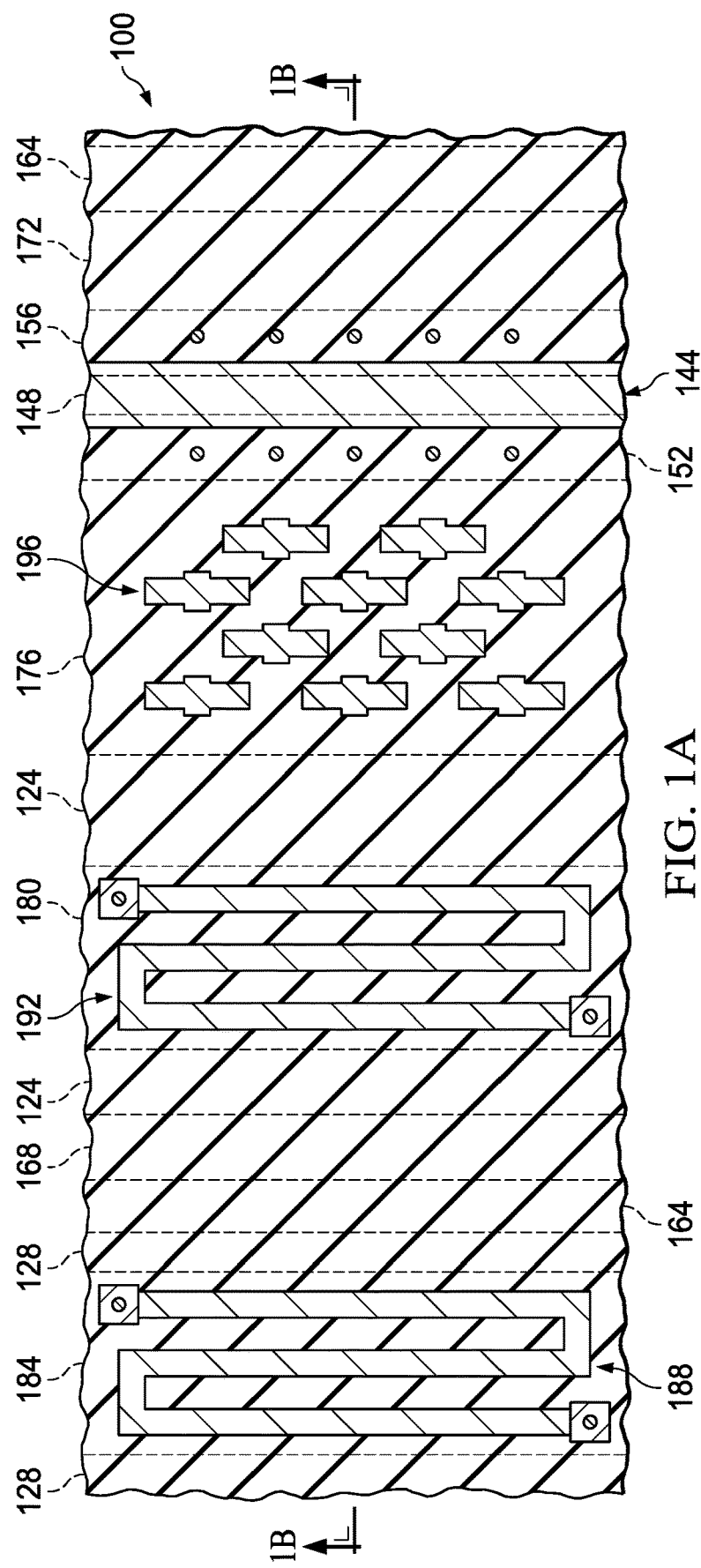
FIGS. 1A and 1B respectively schematically illustrate a semiconductor device, e.g. an integrated circuit, in plan view and sectional view according to various embodiments.
Figure 1B:
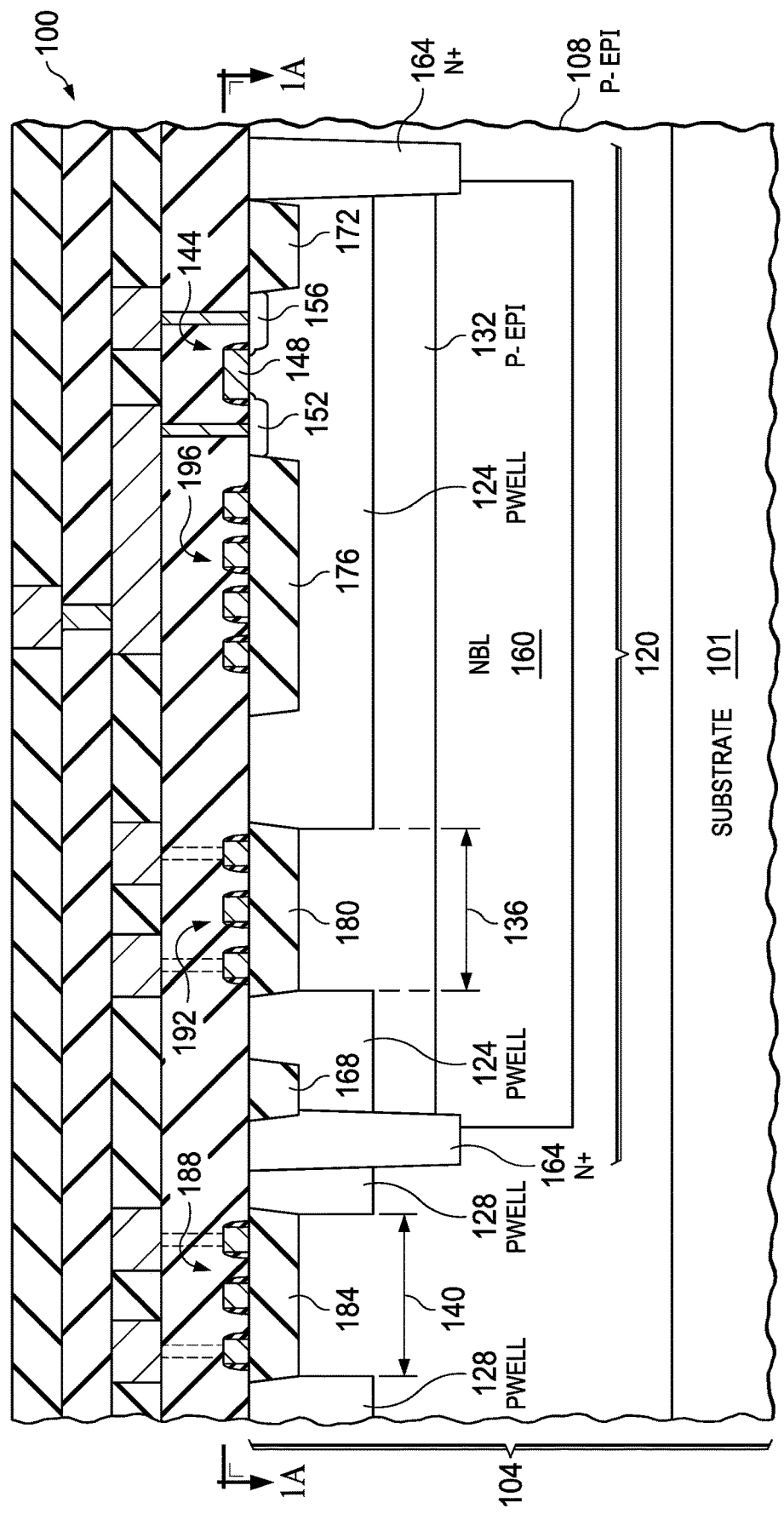

Turning first to FIGS. 1A and 1B, aspects are presented of a semiconductor device 100, e.g. an integrated circuit, formed according to various embodiments. FIG. 1A is a plan view of the device 100 taken at the surface of a gate layer material layer as marked in FIG. 1B, and FIG. 1B is a sectional view of the device 100 taken as marked in FIG. 1A. These figures are described concurrently in the following discussion, wherein same references in FIGS. 1A and 1B refer to same features. The illustrated device is exemplary and schematic in nature, showing some representative components that may be helpful in describing various embodiments.

The device 100 is formed in and on a substrate 104, which includes a wafer 101, and a lightly doped semiconductor layer 108. While the semiconductor layer 108 may be of any type, e.g. silicon, germanium, or gallium arsenide, this discussion refers without limitation to silicon embodiments. The semiconductor layer 108 lies atop an underlying similar material, e.g. a silicon wafer, or a dissimilar material, e.g. a buried oxide layer or a sapphire wafer. The semiconductor layer 108 may be an epitaxial layer grown on the underlying material, e.g. a heavily doped p-type wafer. The semiconductor layer 108 may optionally further be a lightly doped p-type layer. Those skilled in the semiconductor arts understand "lightly doped" to mean doped to a resistivity of about 1-20 ohm-cm. As discussed further below, the substrate 104 may include various doped layers or regions, e.g. wells, buried layers, and isolation structures, as appropriate to the particular device. Without limitation this discussion may refer to the semiconductor layer 108 as an epitaxial layer, p-type epitaxial layer, epi layer or p-epi layer 108.

The device 100 includes within the semiconductor layer 108 an optional isolation tank 120. Described without limitation in terms of the semiconductor layer 108 being a p-type (e.g. a first conductivity type) epi layer, the isolation tank 120 is formed from an n-type (e.g. a second conductivity type) buried layer (NBL) 160, n-type deep wells 164 extending from the surface of the substrate 104 to the NBL 160, and isolation structures 168, 172. While the isolation structures 168, 172 are shown as shallow trench isolation (STI) structures, in some other embodiments a thermal oxide such as that produced in a LOCOS process may be used. The isolation tank 120 encloses a shallow well 124 of the same conductivity type as the semiconductor layer 108, e.g. a shallow pwell, and an enclosed portion 132 of the semiconductor layer 108. Unless stated otherwise, for the purpose of the description and the claims the enclosed portion 132 is considered to be part of the semiconductor layer 108. A shallow well 128 is located outside the isolation tank 120. For the purpose of this discussion and the claims, the wells 124, 128 are separate and distinct from the semiconductor layer 108. The wells 124, 128 extend from the surface of the substrate 104 into the semiconductor layer 108. The wells 124 and 128 may be portions of a default shallow pwell layer that is formed in the device 100, e.g. for latch-up or field-FET suppression, in substantially the entire surface not otherwise processed to form implanted regions and isolation structures of various devices. Parasitic effects such as latch-up and field FET may be referred to generally herein as parasitic interactions.

A representative transistor 144 having a gate 148, source 152 and drain 156 is formed within the well 124. While shown as a MOS transistor, the transistor 144 may be of any type, e.g. MOS, bipolar, power or LDMOS. In various embodiments, the device 100 includes both MOS and bipolar transistors. The isolation tank 120 may isolate the transistor 144 from other portions of the integrated circuit, providing signal isolation and/or protection from parasitic interactions. The device 100 may also include additional isolation structures, not shown, in the form of isolation rings and similar structures to provide isolation between transistors and/or wells of different conductivity type. The device 100 further includes unreferenced contacts, vias, and interconnect lines embedded within dielectric layers. These features are representative of interconnect levels that connect the transistor 144 to other transistors of the device 100 to implement an electrical function.

The device 100 further includes three examples of isolation structures 176, 180 and 184. The isolation structures 176, 180 and 184 may also be STI structures or LOCOS structures, and when STI is used may be filled with silicon dioxide or another dielectric material. The isolation structure 176, 180, 184 may be formed consistent with design rules that enforce isolation of non-gate polysilicon features from the substrate 104. The isolation structure 176 is located within the well 124, the isolation structure 180 is located within the enclosed portion 132, but outside the well 124, and the isolation structure 184 is located outside the isolation tank 120 in the semiconductor layer 108.

Located on each of the isolation structures 176, 180, 184 is one or more gate-layer structures formed from the same layer from which the gate 148 is formed, e.g. polysilicon. Referring to FIG. 1A, a passive gate-layer component 188 represented by a resistor is located on the isolation structure 184. Similarly, a passive gate-layer component 192 is located on the isolation structure 180, again represented by a resistor. It is understood that the components 188, 192 are not limited to resistors, but may each include any passive component, such as a conductive trace or a capacitor. By "gate-layer" it is meant that the components 188, 192 are formed from a material layer from which the gate 148 is formed. However, the components 188, 192 may be processed differently than gate 148. For example, the gate 148 may include a silicide layer that is not present on the components 188, 192. Each of the passive components 188 and 192 is electrically connected within a circuit by an appropriate combination of vias, metal interconnects and/or polysilicon interconnects, not shown. As used herein, the term "passive component" includes any electrical component formed by a gate-layer conductive/resistive material that is not a portion of a current-switching component. Specifically, "passive component" expressly excludes transistor gates, but includes conductive traces that connect to transistor gates.

Located on the isolation structure 176 are a number of dummy fill structures 196 that may be electrically conductive. The dummy fill structures 196 may be automatically placed in the gate layer design by a pattern generating program to improve uniformity of a dry etch process used to form the gate-layer features, or of a planarization process that follows deposition of a dielectric layer over the gate-layer structures. The dummy fill structures 196 are not electrically connected to any circuit, and thus are electrically isolated.

The gate 148, the passive components 188, 192, and the dummy fill structures 196 may be formed from a gate-layer material, e.g. polysilicon or a metal that comprises Ta, Ti or W, including silicides of these elements. Polysilicon, when used, may be heavily doped to confer relatively low resistivity. Metals, when used, may have a lower resistivity than polysilicon. In either case, the gate-layer material may be used to form gates of MOS transistors, passive components, and gate-layer interconnect lines (sometime referred to as "metal zero"). In this discussion the gate 148 and the layer from which it is formed are described without limitation as comprising polysilicon.

Conventionally, isolation structures such as the isolation structures 176, 180, 184 are formed within a shallow doped well, such as the default pwell described earlier. In the process of forming such isolation features, a trench is typically formed in the substrate using a masked dry etch process, e.g. a plasma etch. Such a process typically includes forming openings in a photoresist layer to expose portions of the substrate to be removed. Occasionally, a particle may adhere to surface of the substrate after forming the openings in the photo resist layer. Such a particle may block the etch, resulting in a feature referred to herein as a "blocked etch defect".

Figure 2:
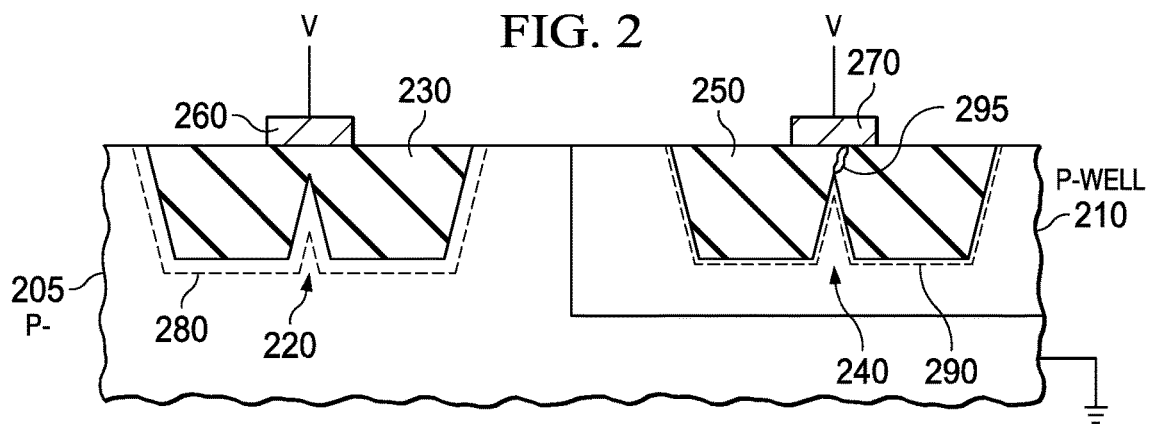
FIG. 2 illustrates examples of blocked etch defects that may compromise reliability of a semiconductor device.

FIG. 2 illustrates two examples of blocked etch defects respectively in a lightly doped p-epi layer 205, and a pwell 210. A defect 220 is located within an isolation structure 230, and a defect 240 is located within an isolation structure 250. Components 260, 270 are respectively located over the isolation structures 230, 250. The components 260, 270 are illustrated as having a potential with respect to the p-epi layer 205, representing the general case of a component operating within an electrically active circuit.

The surface of the substrate adjacent the isolation structure 230 has an associated relatively wide depletion region 280, while the surface of the substrate adjacent the isolation structure 250 has an associated relatively narrow depletion region 290. It is believed that the depletion regions are formed in response to a layer of imperfections at the surface of the p-epi layer 205 that remains after producing the trench into which the isolation structures 230, 250 are formed. Such defects may include, e.g. dangling bonds, which may acquire a charge when an electron fills an unoccupied orbital. Without limitation by theory, it is believed that the presence of such defect-related charges pins the Fermi level at the interior surface of the trench, causing a space-charge layer to form. This space-charge layer in turn leads to a depletion layer extending into the surface of the underlying semiconductor to a sufficient depth to cancel out the space-charge layer potential. This depth is determined in part by the carrier concentration in the semiconductor material, with a lower carrier concentration resulting in a wider depletion region.

Embodiments described herein and otherwise within the scope of the disclosure benefit from the recognition by the inventors that when an isolation structure is located within a lightly doped portion of the substrate, e.g. p-epi, the depletion region is wide enough that charge carriers are effectively eliminated from many blocked-etch defects. This has the effect of electrically passivating the defects, making them less likely to cause electric field concentration that leads to dielectric breakdown events. In contrast, the defects located in a well region, such as the pwell 210, have a sufficient carrier concentration to allow charge concentration in the defect, potentially leading to dielectric breakdown over time.

Considering the defect 240, the dopant concentration in the pwell 210 results in the relatively shallow depletion region 290, such that there is a significant carrier concentration within the defect 240. Thus, under some operating conditions, a large electric field may result at the tip of the defect 240, leading to eventual dielectric breakdown and a conductive short 295 between the component 270 and the substrate.

Conversely, the carrier concentration within the defect 220 is negligible due to the relatively wide depletion region 280. Thus the defect 220 electrically behaves as an insulator, and in particular does not form a large electric field between the defect 220 and the component 260. The presence of the defect 220 in proximity to the component 260 is therefore expected to have a much smaller effect on the lifetime of the electronic device of which the component 260 is a part.

Figure 3:
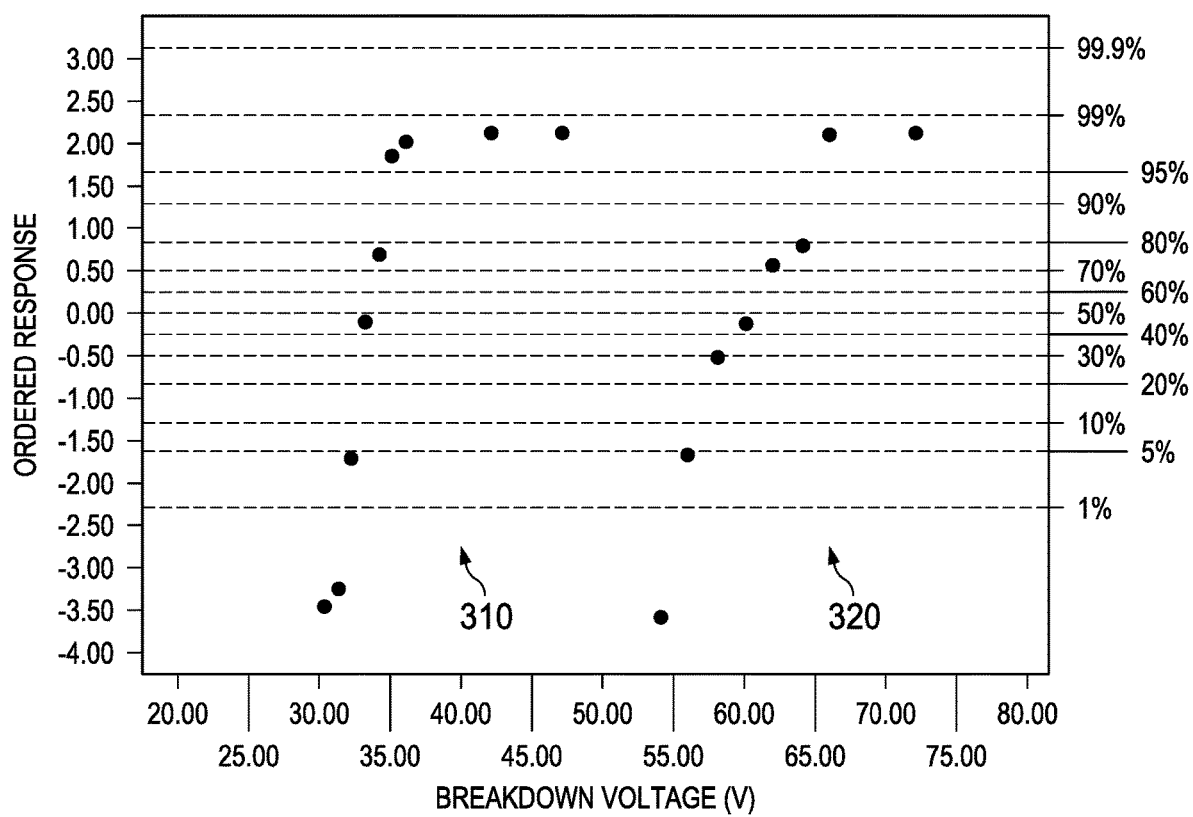
FIG. 3 presents experimental data illustrating breakdown voltage in test devices with and without implementation of described embodiments.

This effect is illustrated in FIG. 3, which shows device reliability, as determined by a test device, plotted on a normal probability plot. Data set 310 represents breakdown voltage failures for a population of nominally identical baseline devices, in which isolation structures are formed within a substrate doped to a majority charge carrier concentration typical of a pwell. Data set 320 represents breakdown voltage failures for a population of nominally identical non-baseline devices formed according to embodiments described herein, in which isolation structures are formed within a substrate doped to a majority charge carrier concentration typical of a lightly doped p-epi layer. With a median breakdown voltage of about 65V, the non-baseline devices of the data set 320 show about two times the breakdown voltage of the baseline devices of the data set 310. It is expected that the areal density of blocked etch defects in the baseline and non-baseline devices is the same, so the marked improvement of breakdown voltage is believed to be attributable to the reduction of electric field concentration at the tip of the defects.

Returning to FIG. 1B, the device 100 includes a gap 136 in the pwell 124 corresponding to the isolation structure 180, and a gap 140 in the pwell 128 corresponding to the isolation structure 184. The gap 136 laterally spaces apart, relative to the top surface of the substrate 104, a first portion of the pwell 124, e.g. a right-hand portion as shown in FIG. 1B, from a second portion of the pwell 124, e.g. a left-hand portion as shown in FIG. 1B. The isolation structure 180 directly contacts the underlying enclosed portion 132 of the lightly doped semiconductor layer 108 exposed by the gap 136, while the isolation structure 184 directly contacts the underlying semiconductor layer 108 exposed by the gap 140. The components 188, 192 are thus expected to have a greater reliability due to the formation of the isolation structures 180, 184 directly within lightly doped material instead of within a pwell region. While it is expected that etch block defects will form under some of the dummy fill structures 196, these features are typically electrically floating, so a large electric field would not be expected to form at any such defects. And in any case, the dummy fill structures 196 are not conductively coupled to any circuit elements, so any short that did form would not impact the electrical performance or reliability of the device 100.

Omitting the well implant under the isolation structures 180, 184 is contrary to conventional practice. For various reasons conventional design practice places a pwell in most portions of an electronic device that are not occupied by an nwell, for example to suppress parasitic interactions as described earlier. It was predicted in this work that such omission would not have any significant effect on device reliability due to the expectation that the potential between the defect and an overlying polysilicon feature would overcome the surface charge layer and pull carriers into the defect. Furthermore, there was no a priori understanding that charge depletion in defects due to Fermi pinning would significantly exclude mobile charge carriers from blocked etch defects. For at least these reasons the doubling of test device breakdown voltage exhibited in FIG. 3 is a wholly unexpected and unambiguously favorable result.

In various embodiments the omission of the well under the passive polysilicon devices is implemented by design rules that affect the placement of optical elements on photomasks used in the fabrication of an electronic device of which the device 100 is representative. As described earlier, design rules conventionally place shallow pwell under passive components and dummy gate-layer features. In various embodiments the exclusion of shallow pwell under passive components is implemented by use of a new design blocking layer, referred to herein as PWELLBLK. The PWELLBLK layer is used to exclude pwell implant from areas of a circuit design that would otherwise receive the implant based on default design rules. PWELLBLK geometries may be applied to designs that include broad-area pwell implant. The PWELLBLK is tangibly implemented on a photomask used to define open areas of a resist pattern for the well implant. Other embodiments may implement an nwell in an n-type substrate, in which case the blocking layer may be referred to as NWELLBLK.

Figure 4:
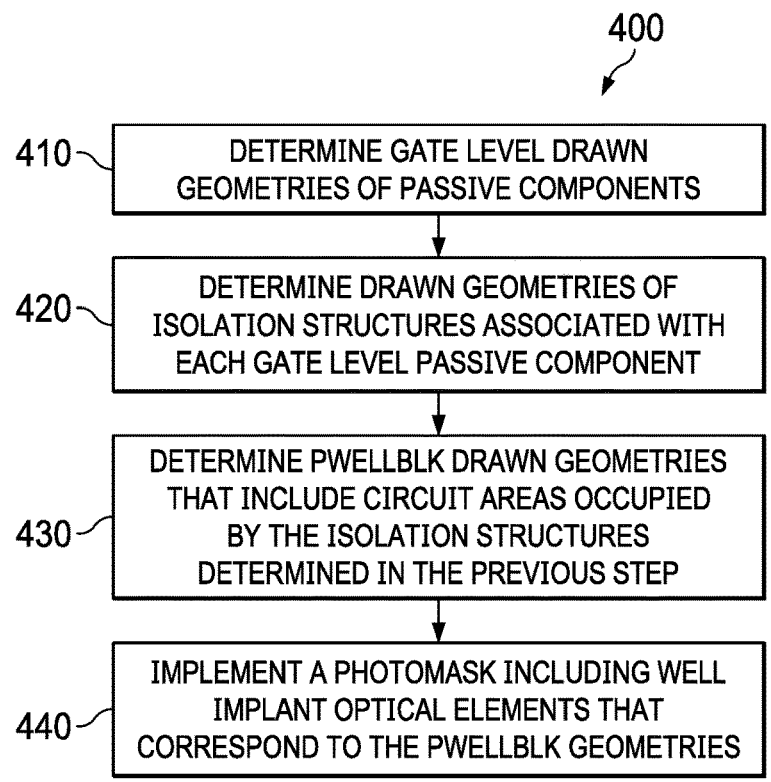
FIG. 4 is a method of implementing a photomask according to various embodiments.

FIG. 4 presents a method 400, e.g. of producing a photomask that implements one or more described embodiments. In a first step 410, gate-layer drawn geometries are generated of passive components in an integrated circuit design, e.g. the components 188, 192 (FIGS. 1A/1B). These geometries may be determined by conventional circuit design rules. In a step 420, isolation structure drawn geometries are generated corresponding to the passive components identified in the previous step, e.g. corresponding to the isolation structures 180 and 184. Again, these isolation features may also be determined by conventional circuit design rules. In a step 430, drawn geometries of a well implant blocking layer are determined, e.g. the PWELLBLK layer described previously. These geometries correspond to the isolation structures determined in the previous step. By "correspond to", it is meant that each blocking geometry is configured to result in a portion of a photoresist layer that at least partially blocks a well implant under a particular one of the isolation structures determined in the previous step. A particular blocking geometry may or may not have a same size and geometric extent as the isolation structure to which it corresponds. For example, a blocking geometry may be larger than its corresponding isolation structure so as to guarantee complete overlap of the isolation structure in view of alignment tolerances. Finally, in a step 440 a photomask is implemented that includes optical elements that correspond to the PWELLBLK layer drawn geometries.

Those skilled in the art of photomask design and manufacturing are familiar with the tools and procedures available to implement a photomask with the desired optical elements to produce the well layer. In this method, "implement" includes acquisition of the photomask by any means, for example direct generation of the photomask by a manufacturer of the device 100, or acquisition of the photomask via a contractual relationship with a producer of photomasks. Furthermore, an optical element that corresponds to a particular geometry may be a positive element or a negative element, and may include any sub-elements needed to properly render the particular geometry in the desired layer of the semiconductor device, e.g. optical proximity correction (OPC) features. In an additional step, described further below, the photomask may be used to produce a photoresist pattern that blocks a well-implant process in areas of the circuit having electrically connected passive components on corresponding isolation structures.

Figure 5A:
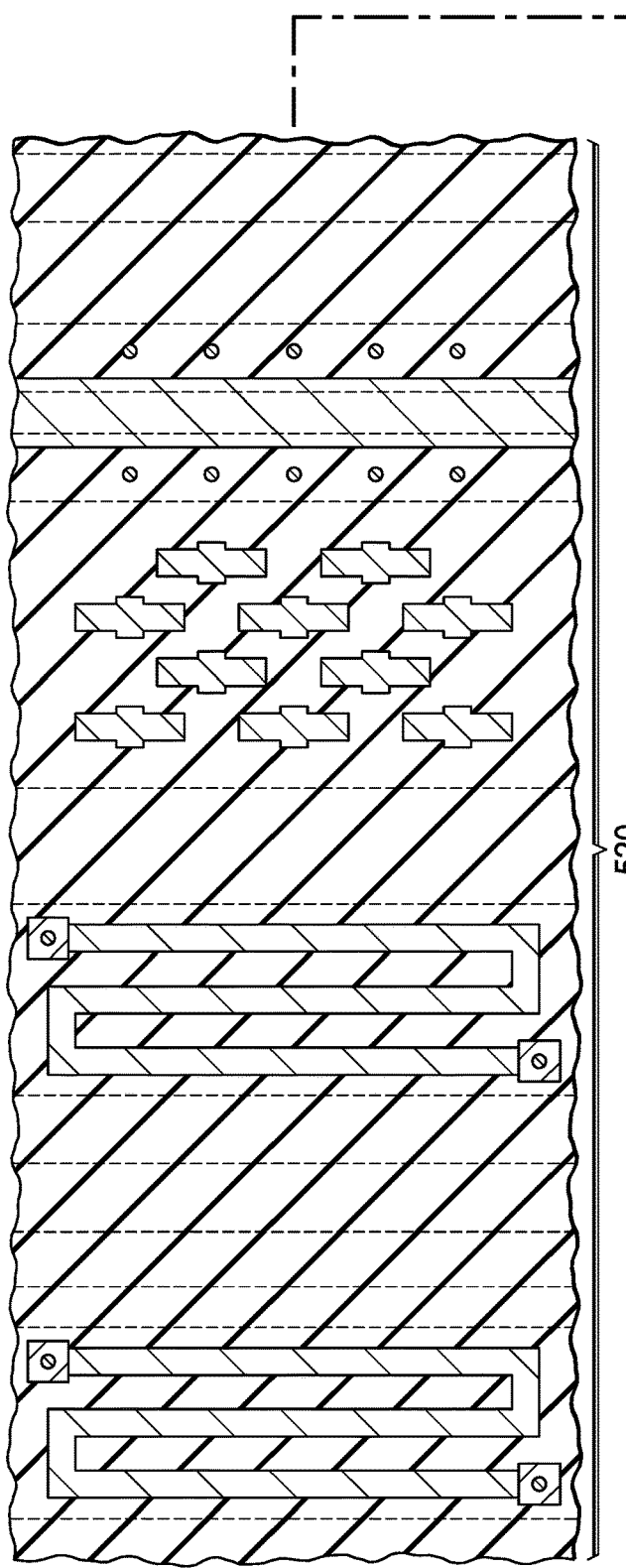
FIGS. 5A-5E illustrate steps of a circuit pattern generation method to implement various embodiments, e.g. the method of FIG. 4, thereby producing a well implant photomask.
Figure 5A:
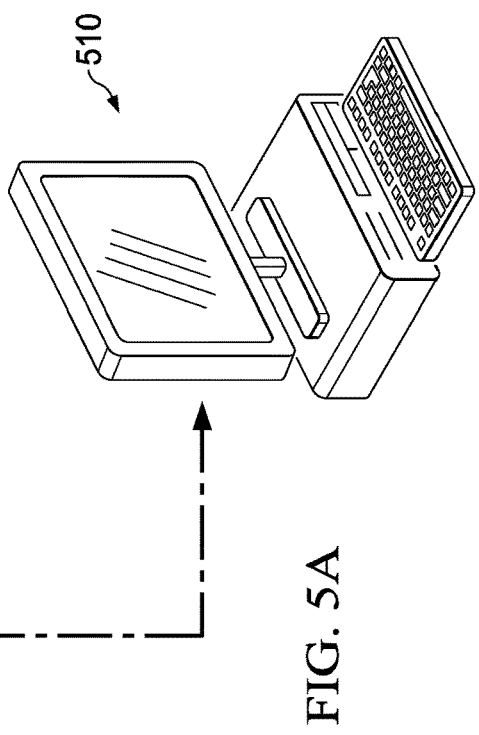

FIGS. 5A-5E graphically summarize some steps that may be performed to implement the method 400 in a pattern generation stage of the circuit design. In FIG. 5A a representative computer system 510 receives a design file 520 that includes design elements to be rendered in the physical design of the device 100. The computer system 510 includes software designed to translate desired features to be implemented in the circuit design to several photomask levels used in the device manufacturing process. Such software may be commercially available, or may be proprietary, and may be conventional with the exception of the steps described herein. The software may produce an output file for use in generating the photomask in one of several available formats, e.g. MEBES, GDS-II or OASIS. The computer program that implements the steps of the method 400, and the resulting output files, may be stored locally in the computer system 510 in a nontransitory computer-readable medium, such as magnetic storage or flash memory, may be stored in a portable nontransitory computer-readable medium for transport, or may be transmitted electronically, e.g. via proprietary LAN (local area network) or the Internet. In the illustrated example, the design elements include the passive components 188, 192, the dummy fill structures 196, the transistor 144, isolation structures 176, 180 and 184, and shallow wells 124, 128. (See FIGS. 1A/1B.)

Figure 5B:
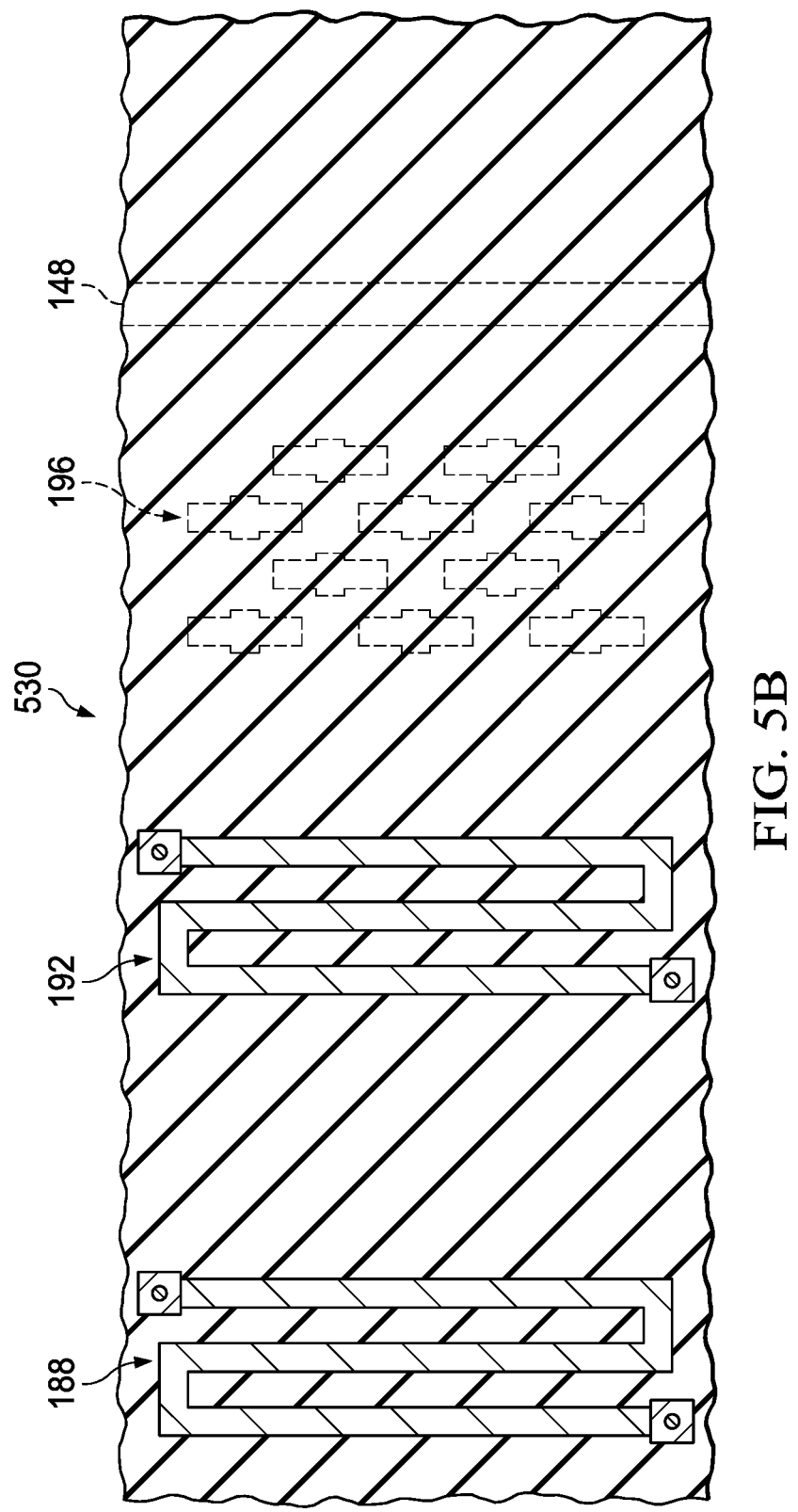

FIG. 5B illustrates a representation of gate-layer drawn geometries 530 determined by the computer system 510 for the device 100. These geometries correspond to electrically-connected passive components, e.g. the components 188 and 192, and may be represented by data structures within the computer system 510. The gate 148 and dummy fill structures 196 are shown for reference with dashed lines, indicating they are excluded from the drawn geometries because they are either not passive components (e.g. the gate 148) or are not electrically connected (e.g. the dummy fill structures 196).

Figure 5C:
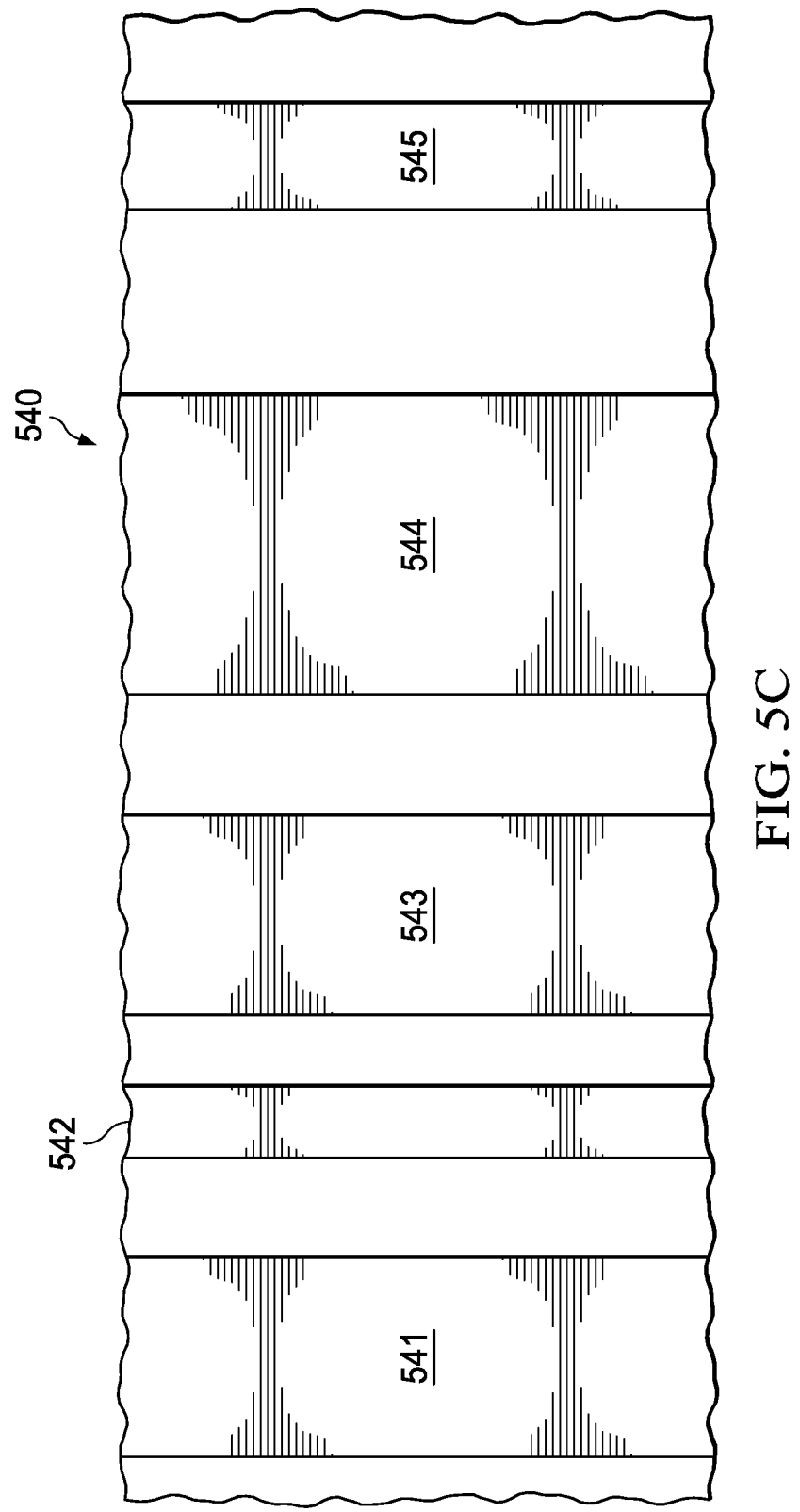

FIG. 5C illustrates a representation of an isolation level of the device 100 design. The computer system 510 has generated isolation geometries 541, 542, 543, 544 and 545, collectively referred to as drawn isolation geometries 540. The drawn geometry 541 corresponds to the isolation structure 184, the drawn geometry 542 corresponds to the isolation structure 168, the drawn geometry 543 corresponds to the isolation structure 180, the drawn geometry 544 corresponds to the isolation structure 176, and the drawn geometry 545 corresponds to the isolation structure 172. The drawn geometries 540 may be represented by data structures within the computer system 510.

Figure 5D:
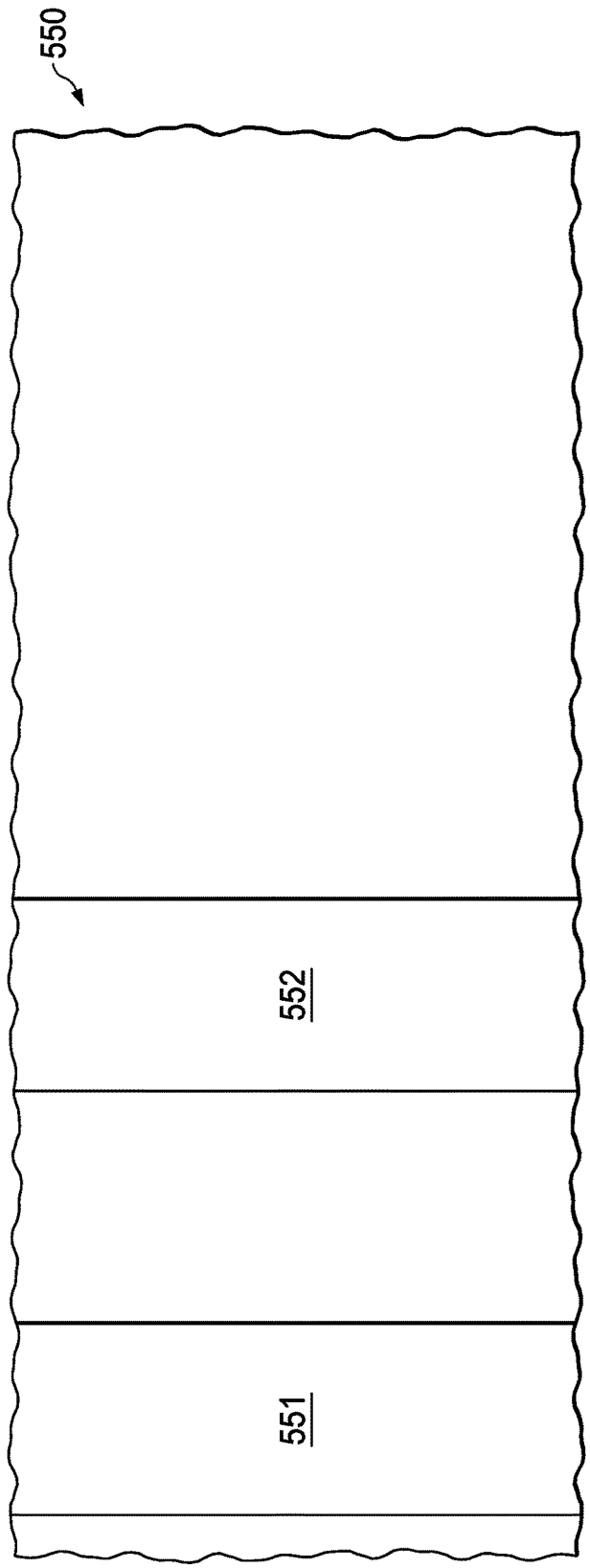

FIG. 5D illustrates a representation of a PWELLBLK layer determined by the computer system 510 that includes a drawn PWELLBLK 551 and a drawn PWELLBLK 552, collectively referred to as PWELLBLK geometries 550. These geometries correspond to a proper subset of the drawn isolation geometries 540, each member of the subset corresponding to a passive component. In the present example the drawn PWELLBLK 551 corresponds to the isolation structure 541 (and the component 188), and the drawn PWELLBLK 552 corresponds to the isolation structure 543 (and the component 192). It can be seen that logically the set of PWELLBLK geometries 550 is the intersection of the set of drawn isolation geometries 540 and the set of passive components in the design. Again, the PWELLBLK geometries may be represented by data structures within the computer system 510.

Figure 5E:
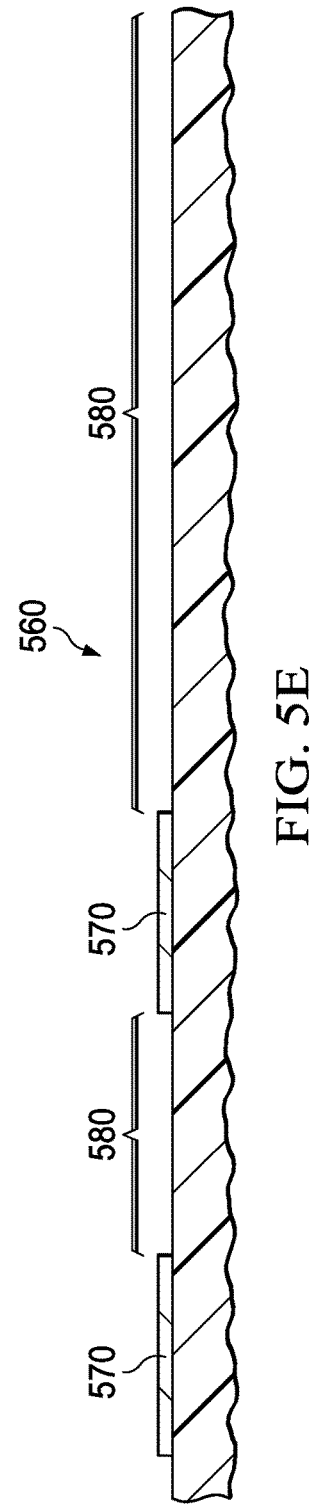

FIG. 5E illustrates a photomask 560 that may result from the preceding steps. The photomask 560 includes well-implant block geometries 570 that correspond to the PWELLBLK geometries 550 and define a physical extent of areas to be excluded from the well implant. The geometries 570 may be implemented by, e.g., chrome on a glass substrate. Open areas 580 correspond to the extent of the area in which the well implant is allowed. In this example the photomask 560 is a positive mask, in that when used with a positive photoresist will result in resist remaining at locations for which light exposure is blocked by the masking portions 570. In other embodiments a negative mask may be produced, in which the open and blocked portions of the mask are reversed.

Figure 6:
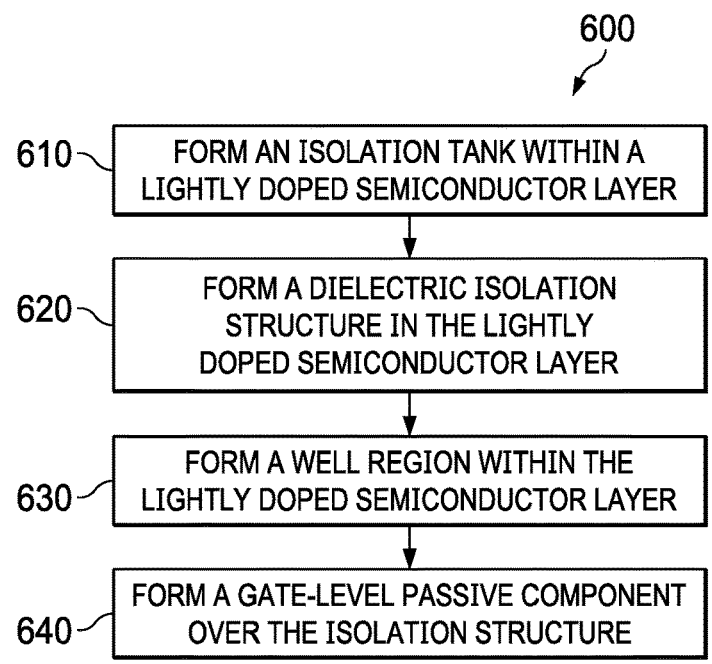
FIG. 6 is a method of producing a semiconductor device according to various embodiments, e.g. using the photomask described by FIG. 5E.

FIG. 6 presents a method 600, e.g. of forming a semiconductor device using the mask 560, according to various embodiments. FIGS. 7A-7E illustrate the semiconductor device 100, for example, in various stages of formation according to the method 600. FIG. 6 is described concurrently with FIGS. 7A-7E in the following discussion. In an optional first step 610, illustrated by FIG. 7A, an isolation tank is formed in the semiconductor layer 108 surrounding the enclosed portion 132. Processes that may include conventional steps have formed the isolation tank 120 bordered by the buried layer 160 and the deep wells 164.

Figure 7A:
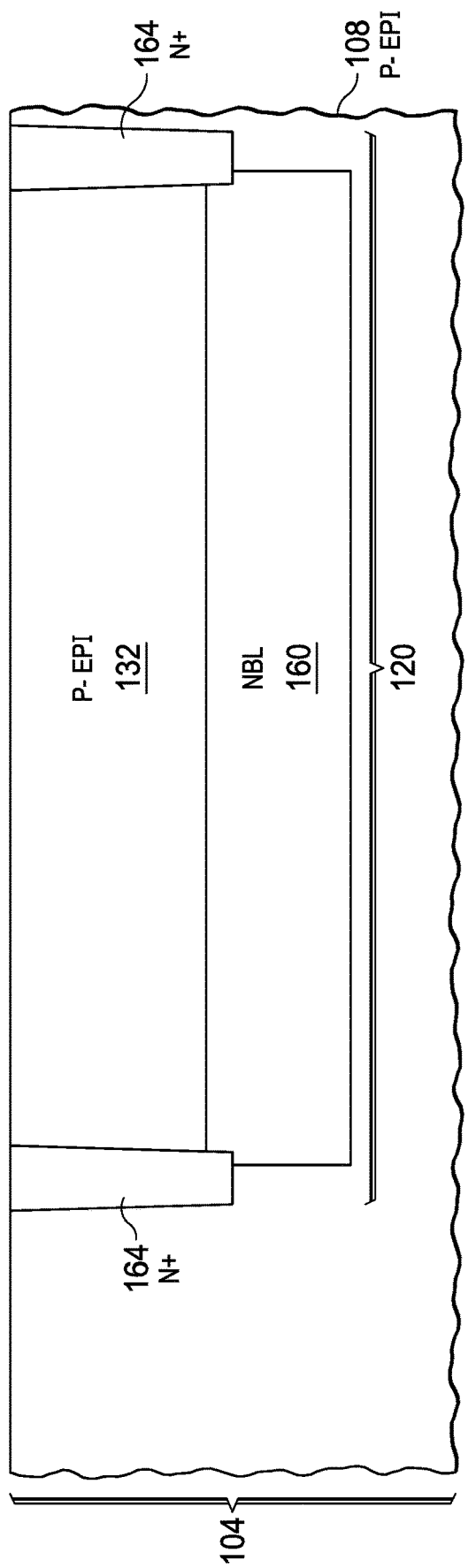
FIG. 7A-7E illustrate an electronic device in progressive steps of formation implementing the method of FIG. 6 to form an integrated circuit, e.g. the device of FIGS. 1A and 1B.
Figure 7B:
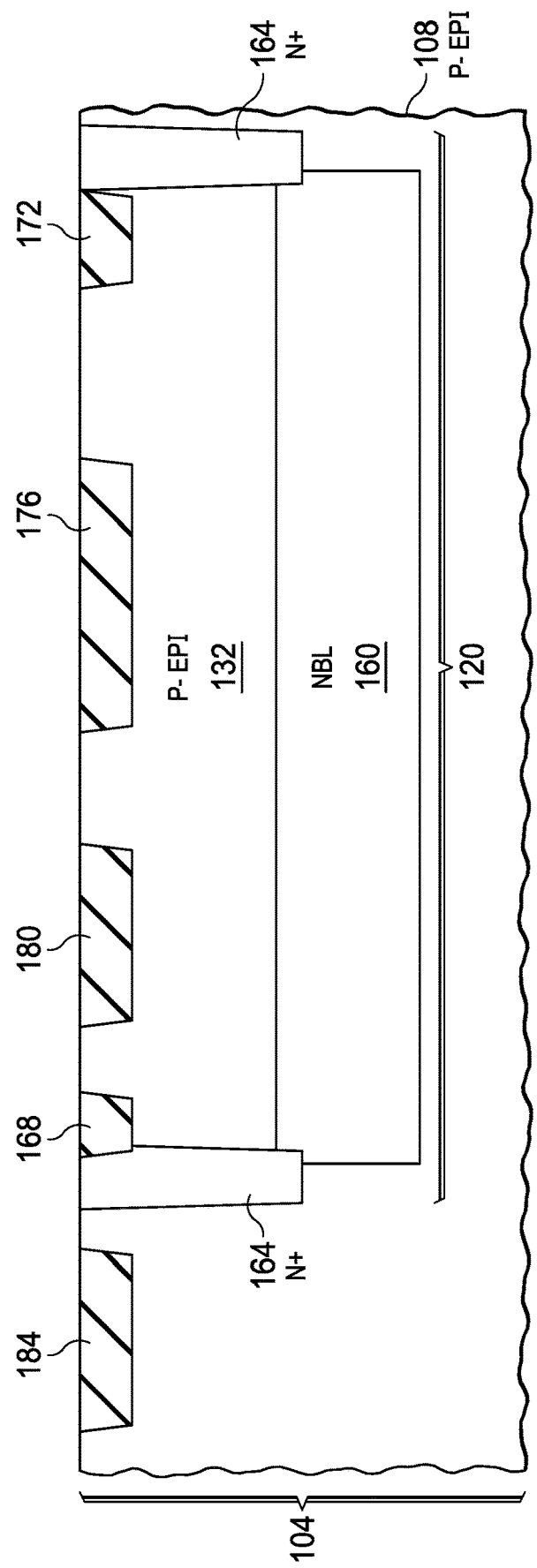

In a step 620 dielectric isolation structures are formed in the lightly doped semiconductor layer. Referring to FIG. 7B, such structures are exemplified by the isolation structure 184 formed within the semiconductor layer 108, and the isolation structures 180 and 176 formed within the enclosed portion 132 of the p-epi layer. Also shown are the isolation structures 168, 172, which for efficiency may be formed simultaneously to the isolation structures 176, 180 and/or 184 as part of an STI or LOCOS process flow.

Figure 7C:
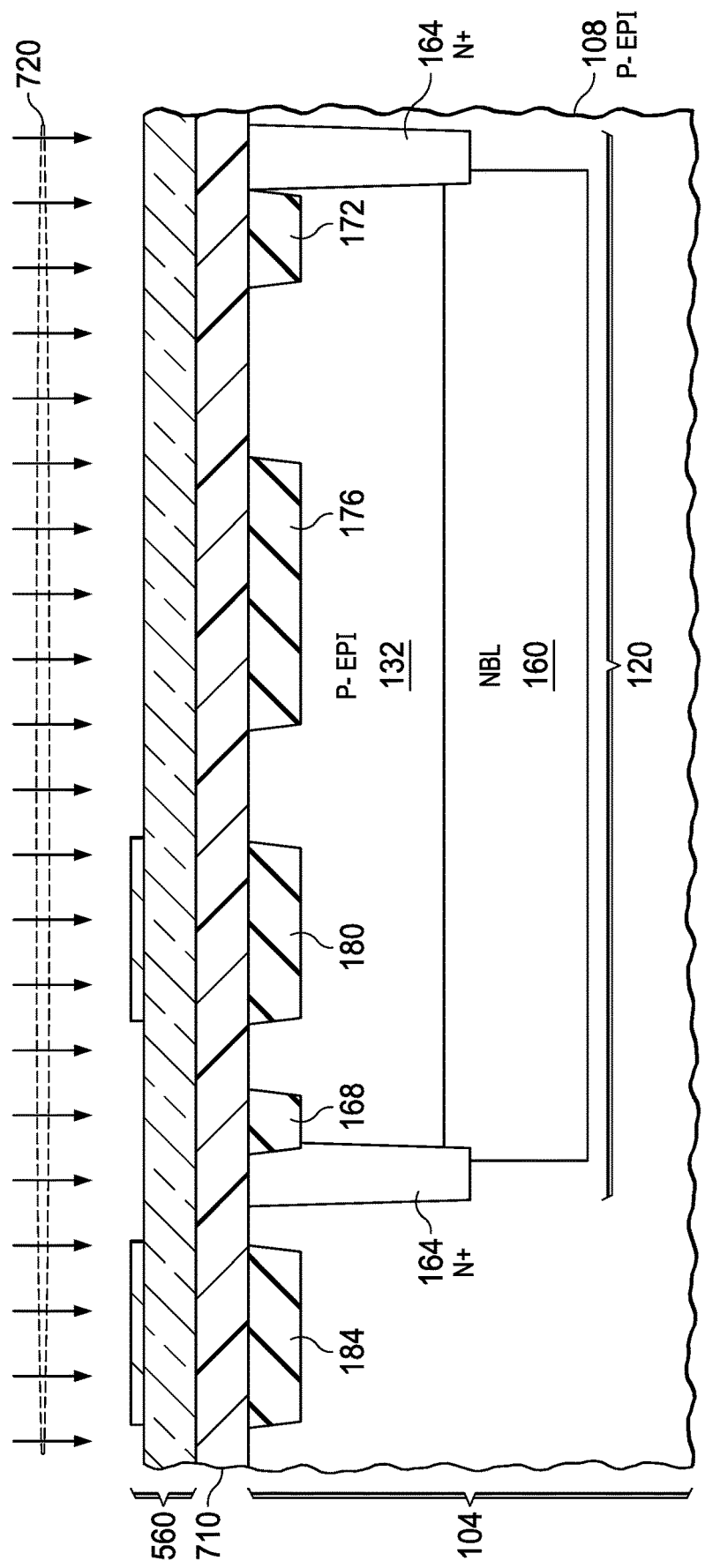
Figure 7D:
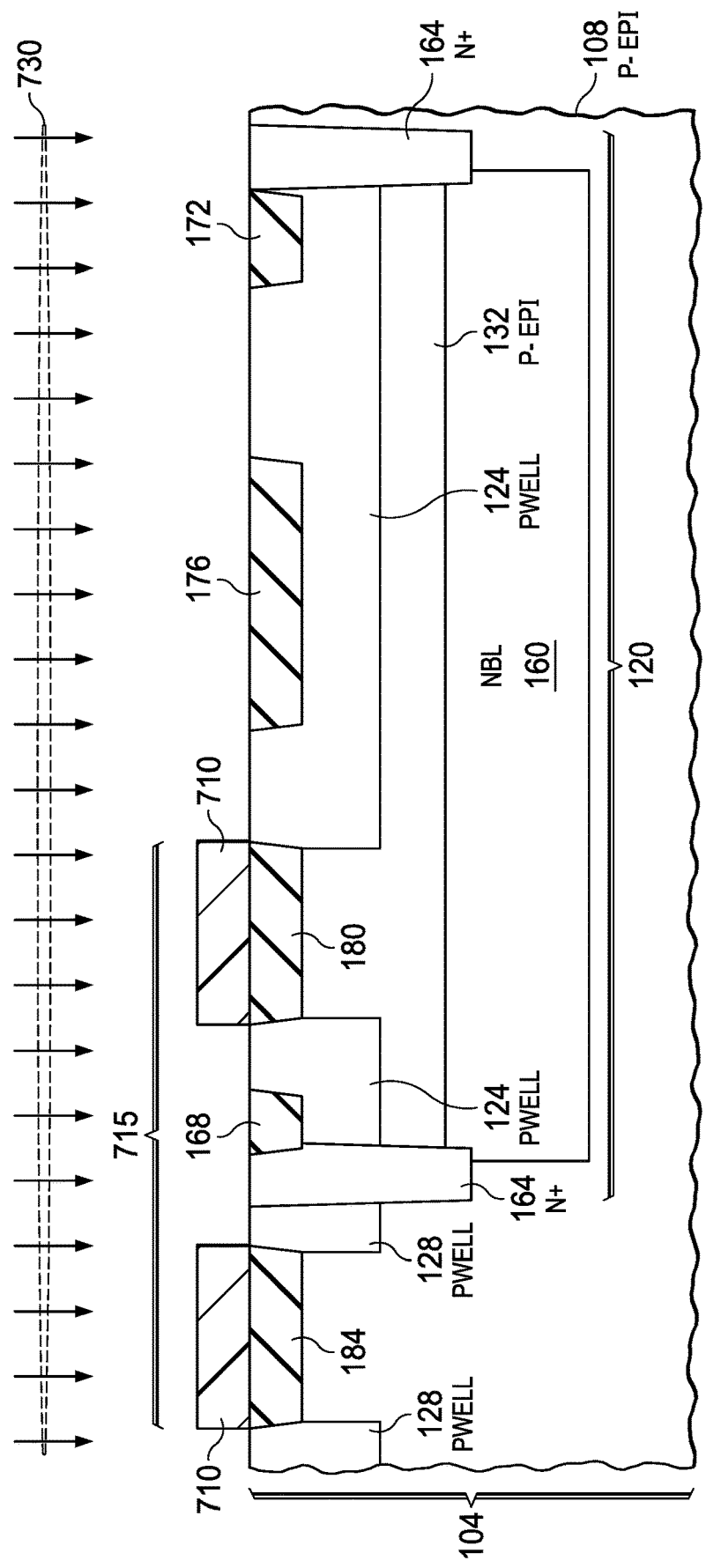

In a step 630 of the method 600, well regions are formed within portions of the semiconductor layer 108, e.g. shallow wells 124 and 128. The well regions may be defined by the open area 580 of the photomask 560. FIG. 7C illustrates the photomask 560 located over a photoresist layer 710 and the substrate 104. A photolithographic process 720 exposes a portion of the photoresist layer 710 over the desired locations of the well regions, e.g. the shallow wells 124 and 128. In FIG. 7D, remaining portions 715 of the photoresist layer 710 block exposure of the substrate 104 to an implant process 730 that implants a dopant, e.g. a p-type dopant such as boron. The implant process 730, typically followed by a diffusion/activation step, produces the shallow wells 124, 128.

Figure 7E:
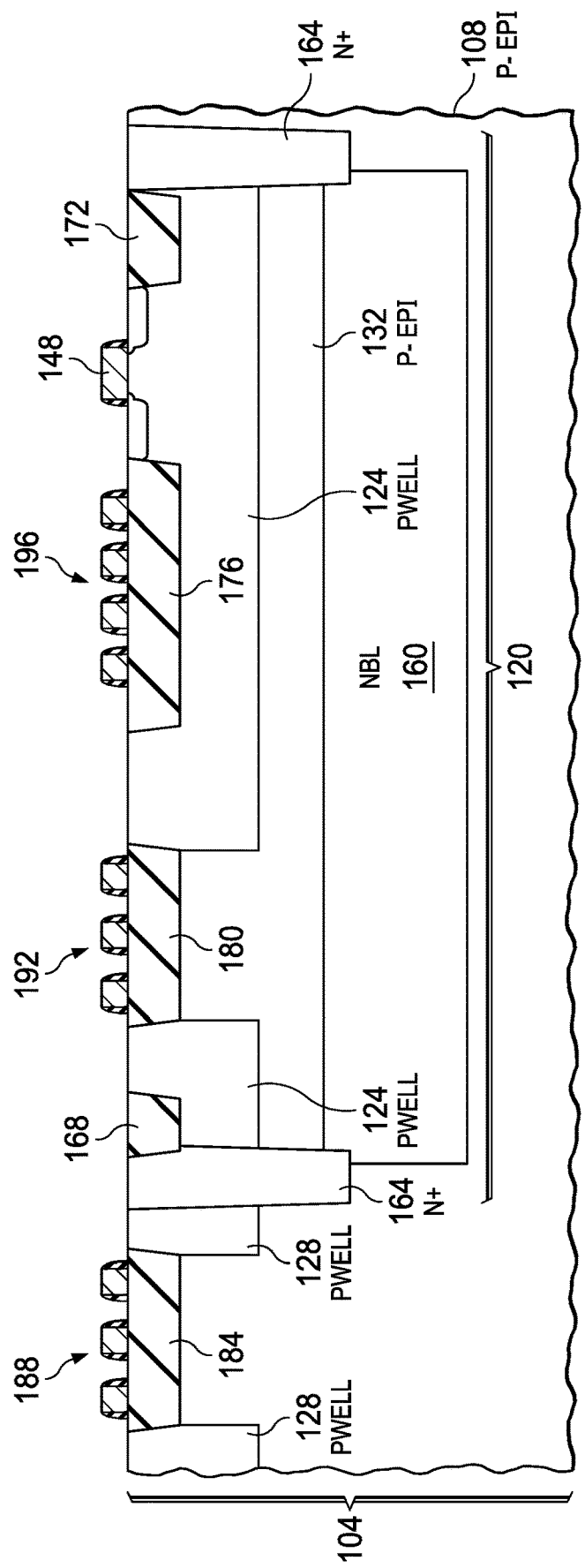

In a step 640, further illustrated referring to FIG. 7E, a gate-layer passive component may be conventionally formed over one or more of the isolation structures formed in the previous steps, e.g. as exemplified by the components 188 and 192. For efficiency the components 188 and 192 may be formed simultaneously with other gate-layer features, e.g. the gate 148 and the dummy fill structures 196. Subsequent processes, not shown, form interconnect levels to produce the device 100 as illustrated in FIG. 1B.

As described earlier, the pwell may be formed over all portions of a device substrate not otherwise utilized to reduce the risk of parasitic interaction. Conversely, removing portions of the pwell may increase the risk of parasitic bipolar or field-FET transistors forming during device operation. Therefore, some embodiments include one or more features that may be used instead of or in addition to the default pwell to reduce parasitic transistor risk in combination with forming the passive gate-layer component over an isolation structure located directly in the lightly-doped substrate.

Figure 8A:
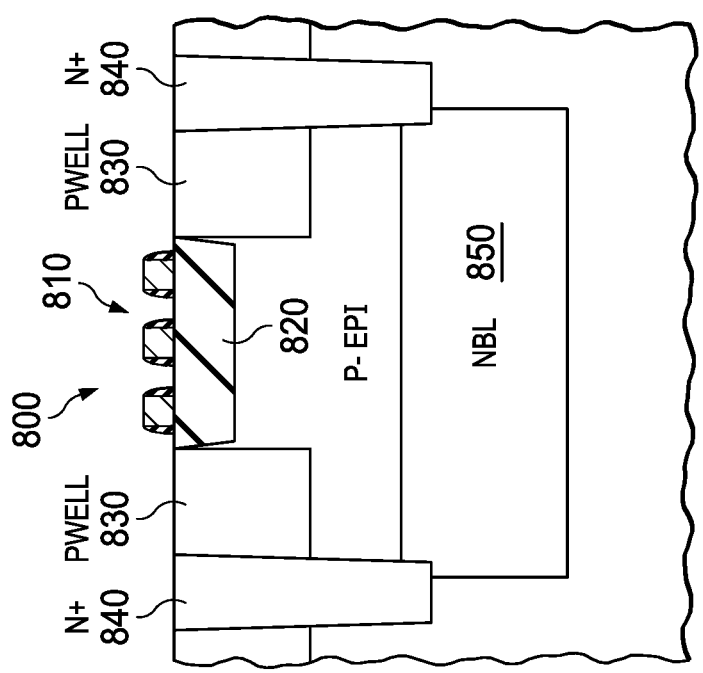
FIGS. 8A-8B show schematic views of embodiments that may reduce parasitic interaction of a passive component, implemented using described embodiments, with neighboring components on a circuit substrate.
Figure 8B:
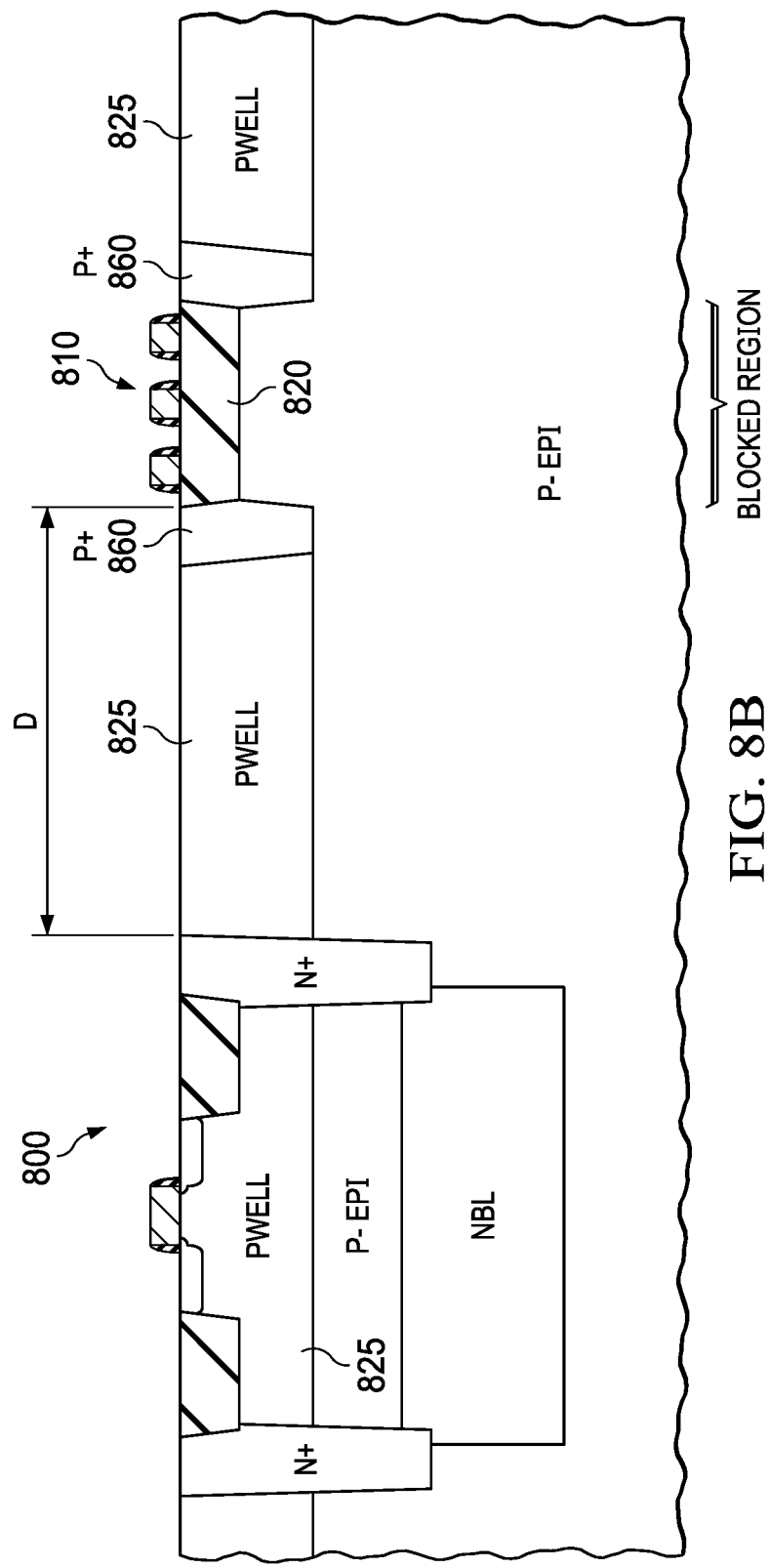

FIGS. 8A and 8B illustrate some examples of such features shown as portions of a device 800. FIG. 8A illustrates an embodiment in which a passive component 810 is located on an isolation structure 820, which is in turn located within a lightly doped p-epi layer. The device 800 includes a shallow pwell 830 with a blocked region as marked in which the pwell implant is blocked as previously described. An isolation tank is provided by n-type deep wells 840 and an n-type buried layer 850. Thus in a manner similar to isolating an active device, e.g. a transistor, the region beneath the isolation structure 820 is isolated from other portions of the device 810 to prevent interaction with neighboring devices via a field FET effect in which a voltage on the component 810 could create an inversion layer below the isolation structure 820.

FIG. 8B illustrates embodiments in which the isolation structure 820 is separated by a lateral spacing D from other portions of the device 810, exemplified by a transistor and isolation tank. It is expected that under many operating conditions, a minimum D of 10 μm will suffice to effectively isolate the component 810 from the isolation tank. In some other cases, depending on doping level and operating voltage, a minimum spacing of 20 μm may be desirable. Additionally, a p+ guard ring 860 is shown surrounding the isolation structure 820. The guard ring 860 may provide additional isolation by limiting the extent of an inversion region under the isolation structure 820. A device formed according to the described embodiments may include one or both of the isolation types exemplified by FIGS. 8A and 8B as appropriate to the design type, doping levels, operating voltages and space constraints.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. An integrated circuit, comprising:
    an epitaxial layer over a semiconductor substrate, the epitaxial layer having a first conductivity type and a top surface;
    a transistor formed in or over the epitaxial layer, the transistor including a polysilicon gate formed in a gate-layer;
    a well region having the first conductivity type located within the epitaxial layer, the well region having first and second well portions with a greater dopant concentration than a dopant concentration of the epitaxial layer, the first well portion spaced apart from the second well portion laterally with respect to the top surface;
    a lightly doped portion of the epitaxial layer located between the first and second well portions; and
    a dielectric isolation structure located between the first and second well portions and directly contacting the lightly doped portion.

2. The integrated circuit of claim 1, further comprising a passive component formed in the gate-layer and located directly on the dielectric isolation structure.

3. The integrated circuit of claim 2, wherein the passive component comprises a resistor.

4. The integrated circuit of claim 2, wherein the passive component comprises polysilicon.

5. The integrated circuit of claim 1, further comprising a doped buried layer having a second conductivity type within the epitaxial layer, wherein the lightly doped portion is located between the dielectric isolation structure and the doped buried layer.

6. The integrated circuit of claim 1, further comprising a transistor located within the well region.

7. The integrated circuit of claim 1, wherein the first conductivity type is p-type.

8. The integrated circuit of claim 1, further comprising a second dielectric isolation structure within the well region, and electrically isolated conductive structures located on the well region.

9. An integrated circuit, comprising:
    a buried layer formed within an epitaxial layer having a top surface and a first conductivity type and located over a semiconductor substrate, the buried layer having a second opposite conductivity type; and
    one or more deep wells having the second conductivity type and extending from the top surface to the buried layer; and
    a lightly doped region having the first conductivity type, the lightly doped region surrounded by the buried layer and the one or more deep wells;
    a shallow well having the first conductivity type within the lightly doped region; and
    a dielectric isolation structure abutting the shallow well having the first conductivity type, wherein the lightly doped region touches the dielectric isolation structure.

10. The integrated circuit of claim 9, further comprising a passive component formed in a gate-layer and located over the dielectric isolation structure.

11. The integrated circuit of claim 9, wherein the dielectric isolation structure is a first dielectric isolation structure, and further comprising a second dielectric isolation structure within the well having the first conductivity type.

12. The integrated circuit of claim 9, wherein the dielectric isolation structure is a first dielectric isolation structure, and further comprising a second dielectric isolation structure outside the well having the first conductivity type.

13. The integrated circuit of claim 12, wherein the epitaxial layer touches the second dielectric isolation structure.

14. The integrated circuit of claim 9, wherein the first conductivity type is p-type.

15. The integrated circuit of claim 9, further comprising a portion of the epitaxial layer located vertically between the buried layer and the semiconductor substrate.

16. The integrated circuit of claim 9, wherein the lightly doped region is junction-isolated from the epitaxial layer by the buried layer and the one or more deep wells.

17. An integrated circuit, comprising:
a first well having a first conductivity type within an enclosed portion of a lightly doped epitaxial layer having the first conductivity type, the enclosed portion touching and being bounded laterally by deep wells having a second opposite conductivity type and further touching and being bounded vertically by a buried layer having the second conductivity type connecting the deep wells;
a transistor formed in or over the first well and having a polysilicon gate electrode formed in a gate-layer;
a dielectric isolation structure touching the enclosed portion of the lightly doped epitaxial layer; and
a passive component formed in the gate-layer and located over the dielectric isolation structure.

18. The integrated circuit of claim 17, wherein the dielectric isolation structure touches the first well.

19. The integrated circuit of claim 17, wherein the passive component includes a polysilicon resistor.

20. The integrated circuit of claim 17, further comprising a second well having the first conductivity type located between the dielectric isolation structure and one of the deep wells.

21. The integrated circuit of claim 17, wherein the first conductivity type is p-type.

* * * * *